United States Patent
Choi

(10) Patent No.: US 7,250,809 B2
(45) Date of Patent: Jul. 31, 2007

(54) BOOSTED VOLTAGE GENERATOR

(75) Inventor: Jun-Gi Choi, Ichon-shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 88 days.

(21) Appl. No.: 11/019,394

(22) Filed: Dec. 23, 2004

(65) Prior Publication Data
US 2005/0248387 A1   Nov. 10, 2005

(30) Foreign Application Priority Data
May 6, 2004   (KR) ................ 10-2004-0031915

(51) Int. Cl.
*G05F 1/10* (2006.01)
(52) U.S. Cl. .................... 327/536; 363/59
(58) Field of Classification Search ........ 327/535–538; 363/59, 60
See application file for complete search history.

(56) References Cited

U.S. PATENT DOCUMENTS

| | | | | |
|---|---|---|---|---|
| 4,695,745 A | * | 9/1987 | Mimoto et al. | 327/536 |
| 5,689,213 A | * | 11/1997 | Sher | 331/57 |
| 5,744,997 A | * | 4/1998 | Kang et al. | 327/537 |
| 5,754,418 A | * | 5/1998 | Park et al. | 363/60 |
| 5,796,293 A | * | 8/1998 | Yoon et al. | 327/536 |
| 6,060,942 A | * | 5/2000 | Oh | 327/536 |
| 6,100,748 A | * | 8/2000 | Oh | 327/526 |
| 6,240,025 B1 | * | 5/2001 | Park | 365/189.09 |
| 6,275,096 B1 | * | 8/2001 | Hsu et al. | 327/535 |
| 6,501,326 B2 | * | 12/2002 | Fujii et al. | 327/536 |
| 6,518,831 B1 | * | 2/2003 | Hur et al. | 327/537 |
| 6,580,312 B1 | * | 6/2003 | Kim | 327/536 |
| 6,882,215 B1 | * | 4/2005 | Lee | 327/536 |
| 7,129,772 B2 | * | 10/2006 | Kim et al. | 327/536 |
| 2003/0090285 A1 | * | 5/2003 | Sher et al. | 324/763 |
| 2004/0037150 A1 | * | 2/2004 | Park et al. | 365/226 |
| 2006/0013030 A1 | * | 1/2006 | Arimoto et al. | 365/63 |

* cited by examiner

Primary Examiner—Kenneth B. Wells
Assistant Examiner—Thomas J. Hiltunen
(74) Attorney, Agent, or Firm—Lowe Hauptman & Berner LLP

(57) ABSTRACT

The present invention provides a boosted voltage generator of a semiconductor device where a boosted voltage efficiency and drivability at a target boosted voltage level can be evaluated accurately by employing an enable signal generator. The boosted voltage generator includes a boosted voltage pad; a level detection means for detecting whether or not a present boosted voltage reaches a target boosted voltage level; an oscillation means for performing an oscillation mode in response to a signal outputted from the level detection means; a charge pumping means for outputting a level-controlled boosted voltage in response to a signal outputted from the oscillation means; and an enable signal generation means for operating the oscillation means in response to a signal outputted from the level detection means.

8 Claims, 1 Drawing Sheet

BOOSTED VOLTAGE GENERATOR

FIELD OF INVENTION

The present invention relates to a semiconductor device; and, more particularly, to a boosted voltage generator adaptive for the semiconductor device.

DESCRIPTION OF PRIOR ART

As a semiconductor device is highly integrated nowadays, a linewidth between each circuit element becomes continuously narrower and narrower. Therefore, a scale-down of an integrated chip circuit requires a memory device operable with a low operational voltage. To meet the demand, an enhanced design technique suitable for a low-voltage memory device is required also. However, the low-voltage memory device essentially needs a boosted voltage Vpp that is higher than a power supply voltage Vdd, for compensation of a voltage loss and retention of a stored data. The boosted voltage Vpp, typically, can be supplied to the integrated chip circuit by means of a boosted voltage generator. In particular, the boosted voltage generator is widely used for the purpose of compensating the loss caused by a threshold voltage of a MOS transistor in the semiconductor device.

Meanwhile, a test step to measure a boosted voltage efficiency and drivability of a boosted voltage circuit for each die are carried out at a probe test step, which is a kind of a wafer level test.

Referring to FIG. 1, there is shown a block diagram setting forth a prior art boosted voltage generator for use in the semiconductor device.

In FIG. 1, the prior art generator includes a boosted voltage pad 10 for outputting a boosted voltage Vpp, a level detector 20 for detecting whether or not a present boosted voltage level reaches a target boosted voltage level with respect to a predetermined reference voltage, an oscillator 30 for performing an oscillation mode in response to a signal outputted from the level detector 20 and a charge pump 40 for outputting a level-controlled boosted voltage by pumping charges in response to an oscillation signal or a clock signal outputted from the oscillator 30. Here, the boosted voltage pad 10 is also utilized as an input pad in a test mode for forcibly applying a test mode boosted voltage to the boosted voltage generator.

Meanwhile, there are two test mode boosted voltage signals for evaluating the boosted voltage efficiency and the drivability, of which one is a test mode boosted voltage rising signal tm_vppup used for rising the boosted voltage level to a desired level and the other signal is a test mode boosted voltage falling signal tm_vppdown for falling the boosted voltage level to a predetermined level, wherein the test mode boosted voltage signals tm_vppup, tm_vppdown have been already set to be a predetermined condition at a mode-register set (MRS). Conventionally, after measuring the boosted voltage efficiency and the drivability in the wafer level test, a focused ion beam (FIB) lithography is often carried out for correction of the die according to measured data, i.e., the boosted voltage efficiency and the drivability.

In order to evaluate the boosted voltage efficiency according to the prior art, a boosted voltage Vpp below the target boosted voltage level should be applied to the boosted voltage pad 10. That is, by applying the boosted voltage of less than the target boosted voltage level, the level detector 20 can render the oscillator 30 operated. While the oscillator 30 is operated, thereafter, a power supply current Idd corresponding to the power supply voltage Vdd and a boosted voltage current Ipp corresponding to the boosted voltage Vpp are measured by a test probe which is connected to the wafer die, to thereby evaluate the boosted voltage efficiency. According to the prior art boosted voltage generator, however, it is difficult to measure the boosted voltage efficiency corresponding to the target boosted voltage level because the boosted voltage should be lower than the target boosted voltage level for operating the oscillator 30.

Meanwhile, in order to measure the boosted voltage drivability, the level detector 20 should operate the oscillator 20 regardless of the boosted voltage level. But, as described above, the prior art boosted voltage generator has a drawback that the oscillator 30 can not be operable when the boosted voltage reaches a predetermined level, i.e., a target boosted voltage level. In other word, the boosted voltage drivability can be measured when the applied boosted voltage is less than the target boosted voltage level so that it is difficult to evaluate accurate boosted voltage drivability corresponding to the target voltage level in the long run.

SUMMARY OF INVENTION

It is, therefore, an object of the present invention to provide a boosted voltage generator for use in a semiconductor device where a boosted voltage efficiency and drivability at a target boosted voltage level can be evaluated accurately by employing an enable signal generator.

In accordance with an aspect of the present invention, there is provided a boosted voltage generator for use in a semiconductor device including: a boosted voltage pad; a level detection means for detecting whether or not a present boosted voltage reaches a target boosted voltage level; an oscillation means for performing an oscillation mode in response to a signal outputted from the level detection means; a charge pumping means for outputting a level-controlled boosted voltage in response to a signal outputted from the oscillation means; and an enable signal generation means for operating the oscillation means in response to a signal outputted from the level detection means.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a boosted voltage generator for use in a semiconductor device in accordance with the present invention will be described in detail referring to the accompanying drawings.

Figure 1:
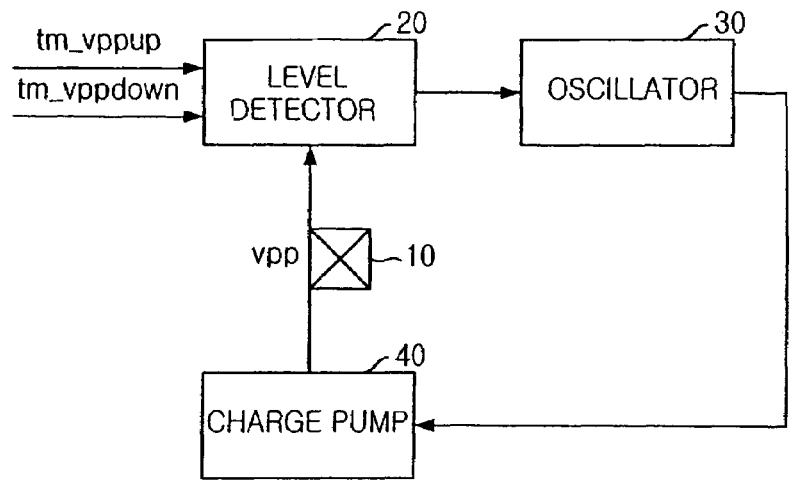
FIG. 1 is a block diagram setting forth a prior art boosted voltage generator for use in a semiconductor device.
Figure 2:
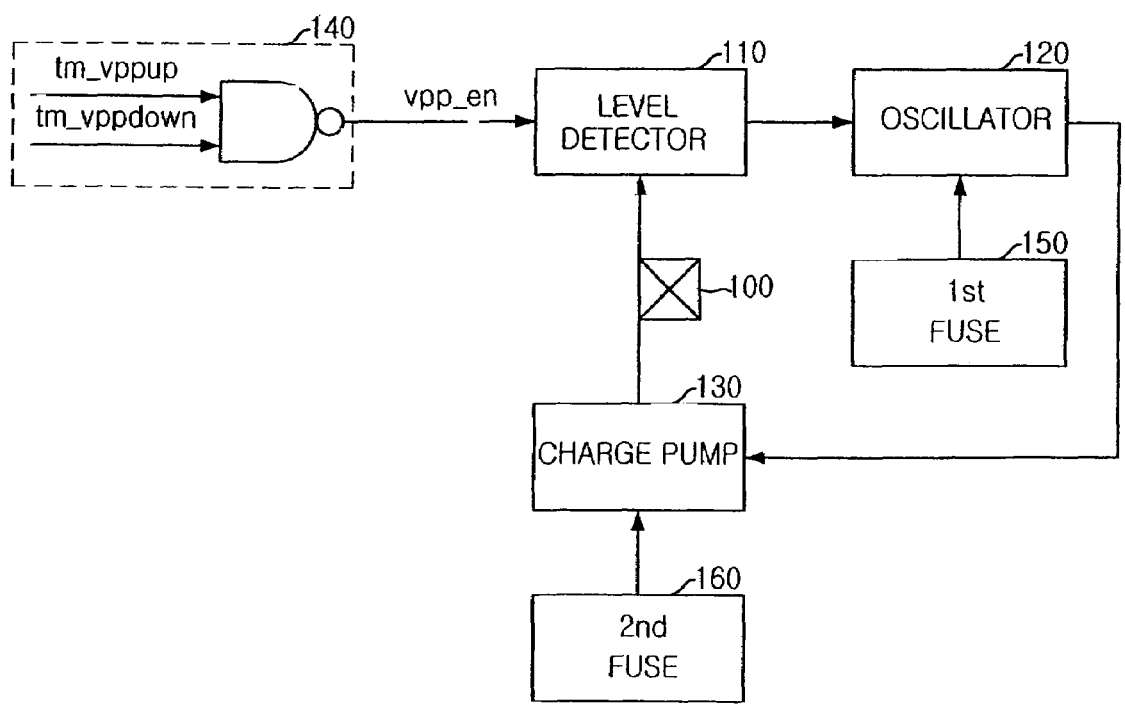
FIG. 2 is a block diagram setting forth a boosted voltage generator for use in a semiconductor device in accordance with a preferred embodiment of the present invention.

Referring to FIG. 2, there is shown a block diagram illustrating a boosted voltage generator of a semiconductor device in accordance with a preferred embodiment of the present invention.

In FIG. 2, the inventive boosted voltage generator includes a level detector 110 for detecting whether or not an actual boosted voltage level becomes a target boosted voltage level with respect to a predetermined reference voltage, an oscillator 120 for performing an oscillation mode in response to a signal outputted from the level detector 110, a charge pump 130 for pumping charges so as to output a level-controlled boosted voltage in response to an oscillation signal or a clock signal outputted from the oscillator 120 and an enable signal generator 140 for generating an enable signal vpp_en in response to test mode signals tm_vppup, tm_vppdown to turn on the level detector 110. Herein, a boosted voltage Vpp is applied to a boosted voltage pad 100 from an exterior apparatus. In addition, the boosted voltage generator of the present invention may further include a first fuse for modulating an oscillation period and a second fuse for modulating pump intensity according to a test mode result.

The enable signal generator 140 in the inventive boosted voltage generator is implemented as a NAND gate where a test mode boosted voltage rising signal tm_vppup and a test mode boosted voltage falling signal tm_vppdown are inputted. That is, in case that two test mode signals tm_vppup, tm_vppdown are high level, the enable signal vpp_en is activated so that the level detector 110 is turned on to operate the oscillator 120. It is preferable that the oscillator 120 use a ring oscillator in the inventive boosted voltage generator.

In a test mode, the target boosted voltage level is forcibly applied to the boosted voltage pad 100 from a test apparatus. At this time, a mode register set (MRS) is encoded such a way that the test mode boosted voltage rising signal tm_vppup and the test mode boosted voltage falling signal tm_vppdown are set to be high in order to evaluate a boosted voltage efficiency and drivability in the test mode. In this case, though the target boosted voltage is forcibly applied to the boosted voltage pad 100 for measuring boosted voltage efficiency and drivability, the signal outputted from the level detector 110 renders the oscillator 120 operable because the enable signal vpp_en of the enable signal generator 140 turns on the level detector 110. Accordingly, the charge pump 130 is also working because the oscillator 120 performs the oscillation mode. In the present invention, since a power supply current Idd corresponding to the power supply voltage Vdd and a boosted voltage current Ipp corresponding to the boosted voltage Vpp are measured while applying the target boosted voltage level to the boosted voltage pad 100, it is possible to accurately evaluate the boosted voltage efficiency and the drivability at the target boosted voltage level.

The boosted voltage efficiency and the drivability resulted from the test mode are utilized as a reference data for cutting the first and the second fuses 150, 160. In detail, in case that the measured boosted voltage efficiency is higher than a predetermined simulated value, e.g., if the measured boosted voltage efficiency is 36% and the simulated efficiency is 34%, it is possible to reduce the power supply current Idd consumption by cutting the first fuse 150. Additionally, if the measured boosted voltage drivability is higher than a preset simulated value, e.g., if the measured boosted voltage drivability is 35 mA and a preset simulated drivability is 30 mA, the boosted voltage current Ipp consumption can be reduced by cutting the second fuse 160.

The present invention, as aforementioned already, provides an advantageous merit that it is possible to measure the boosted voltage efficiency and the boosted voltage drivability accurately for each die at the target boosted voltage level. Accordingly, the inventive boosted voltage generator can be optimally designed to be adaptive for a low-voltage memory device because the oscillation period and the pump intensity can be easily and accurately controlled by using the measured data, i.e., the measured boosted voltage efficiency and the drivability corresponding to the target boosted voltage level. Furthermore, there is not happened excessive boosted voltage current Ipp so that it is possible to reduce an unnecessary current consumption in the device. As a result, the inventive boosted voltage generator provides accurate information for the boosted voltage efficiency and the drivability of a low-voltage memory device so that it is helpful for failure analysis.

In the present invention, though the test mode boosted voltage rising signal tm_vppup and the test mode boosted voltage falling signal tm_vppdown are utilized for generating the enable signal vpp_en at the enable signal generator 140, the other test mode signals can be used by setting the MRS differently. In case of using the other test mode signals, the enable signal generator 140 may be embodied as the other logic circuit which is different from the present invention.

The present application contains subject matter related to the Korean patent application No. KR 2004-31915, filled in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A boosted voltage generator comprising:
   a level detection means for detecting whether or not a present boosted voltage reaches a target boosted voltage level;
   an oscillation means for performing an oscillation mode in response to a signal outputted from the level detection means;
   a charge pumping means for outputting a level-controlled boosted voltage in response to a signal outputted from the oscillation means;
   an enable signal generation means for operating the level detection means in response to a test mode boosted voltage rising signal and a test mode boosted voltage falling signal;
   a first fuse for modulating an oscillation period of the oscillation means according to a comparison result between measured and simulated efficiencies; and
   a second fuse for modulating a pumping intensity of the charge pumping means according to the comparison result.

2. The boosted voltage generator as recited in claim 1, wherein, in a test mode, the test mode boosted voltage rising signal is used for raising a level of the level-controlled boosted voltage to a predetermined level and the test mode boosted falling signal is used for lowering the level of the level-controlled boosted voltage to a predetermined level.

3. The boosted voltage generator as recited in claim 2, wherein a target boosted voltage is applied to a boosted voltage pad from a test apparatus in a test mode.

4. The boosted voltage generator as recited in claim 3, wherein the enable signal generation means includes a NAND gate where the test mode boosted voltage rising signal and the test mode boosted falling signal are inputted.

5. The boosted voltage generator as recited in claim 1, wherein a target boosted voltage is applied to the boosted voltage pad from a test apparatus in the test mode.

6. The boosted voltage generator as recited in claim 5, wherein the enable signal generation means includes a NAND gate where the test mode boosted voltage rising signal and the test mode boosted falling signal are inputted.

7. The boosted voltage generator as recited in claim 1, wherein the oscillation means includes a ring oscillator.

8. A boosted voltage generator comprising:

a level detector arranged to generate a signal indicative of a present boosted voltage reaching a target boosted voltage level;

an oscillator arranged to perform an oscillation mode responsive to the level detector signal;

a charge pump arranged to generate a level-controlled boosted voltage responsive to a signal from the oscillator;

an enable signal generator arranged to transmit a signal to the level detector responsive to a test mode boosted voltage rising signal and a test mode boosted voltage falling signal;

an oscillator fuse arranged to modulate an oscillation period of the oscillator, wherein the oscillator fuse is further arranged to be modified based on a comparison result between a measured and a simulated efficiency; and a charge pump fuse arranged to modulate a pumping intensity of the charge pump, wherein the charge pump fuse is further arranged to be modified based on the comparison result.

* * * * *